United States Patent
Segoria et al.

(10) Patent No.: US 8,811,919 B2
(45) Date of Patent: Aug. 19, 2014

(54) SYSTEM AND METHOD FOR GENERATING A DEFINED PULSE

(75) Inventors: Anthony F. Segoria, San Diego, CA (US); Jorge A. Garcia, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 974 days.

(21) Appl. No.: 12/558,165

(22) Filed: Sep. 11, 2009

(65) Prior Publication Data

US 2011/0058623 A1   Mar. 10, 2011

Related U.S. Application Data

(60) Provisional application No. 61/239,965, filed on Sep. 4, 2009.

(51) Int. Cl.
| | |
|---|---|
| *H01Q 11/12* | (2006.01) |
| *H03K 5/07* | (2006.01) |
| *H04L 25/03* | (2006.01) |
| *H03K 7/04* | (2006.01) |
| *H04B 1/717* | (2011.01) |
| *H04B 1/7163* | (2011.01) |
| *H04B 1/69* | (2011.01) |

(52) U.S. Cl.
CPC .......... *H03K 7/04* (2013.01); *H04B 2001/6908* (2013.01); *H03K 5/07* (2013.01); *H04L 25/03* (2013.01); *H04B 1/7174* (2013.01); *H04B 1/71632* (2013.01)
USPC .............. 455/119; 375/295; 330/51; 327/306

(58) Field of Classification Search
USPC .............. 455/119; 375/295; 330/51; 327/306
See application file for complete search history.

(56) References Cited

U.S. PATENT DOCUMENTS

| 5,059,977 A | 10/1991 | Herman et al. |
|---|---|---|
| 5,177,455 A * | 1/1993 | Bennett .................. 332/103 |

(Continued)

FOREIGN PATENT DOCUMENTS

| EP | 2034686 A2 | 3/2009 |
|---|---|---|
| TW | 200934116 A | 8/2009 |

OTHER PUBLICATIONS

International Search Report and Written Opinion—PCT/US2010/047247, ISA/EPO—May 2, 2011.
Jaejin Jung et al.,"Design of a 6 bit 1.25 GS/s DAC for WPA", Circuits and Systems, 2008, ISCAS, IEEE International Symposium on, IEEE, Piscataway, NJ, USA, May 18, 2008, pp. 2262-2265, XP031271940, ISBN: 978-1-4244-1683-7.

(Continued)

*Primary Examiner* — Hsin-Chun Liao
(74) *Attorney, Agent, or Firm* — Paul S. Holdaway

(57) ABSTRACT

Apparatus for generating a first signal (e.g., a pulse) including a current source adapted to generate a current based on a second signal that defines an amplitude of the current and a third signal that defines the timing of an amplitude change of the current, and an impedance element through which the current flows to generate the first signal. The impedance element may comprise a resonator having a resonant frequency approximate the center of the first signal frequency spectrum. An LO may be used to generate the third signal to control the timing of the amplitude change of the current. A detector may enable the current source in response to detecting a defined steady-state condition of the LO clock signal, and may disable the current source in response to the completion of the first signal. A controller may generate the second signal to control the current amplitude so as to perform power control and/or other functions.

31 Claims, 7 Drawing Sheets

(56) References Cited

U.S. PATENT DOCUMENTS

| | | | |
|---|---|---|---|
| 5,724,007 A * | 3/1998 | Mar .............................. | 331/1 A |
| 2006/0038710 A1 | 2/2006 | Staszewski et al. | |
| 2008/0061871 A1 | 3/2008 | Abe et al. | |
| 2008/0157895 A1 * | 7/2008 | Immonen et al. ............. | 332/155 |

OTHER PUBLICATIONS

Taiwan Search Report—TW099129926—TIPO—Mar. 6, 2013.

* cited by examiner

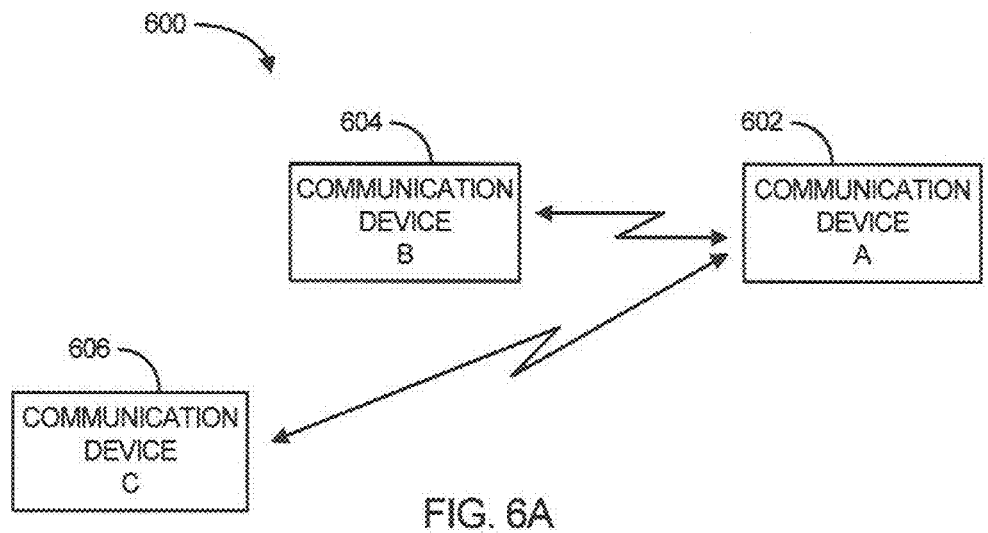
FIG. 6A
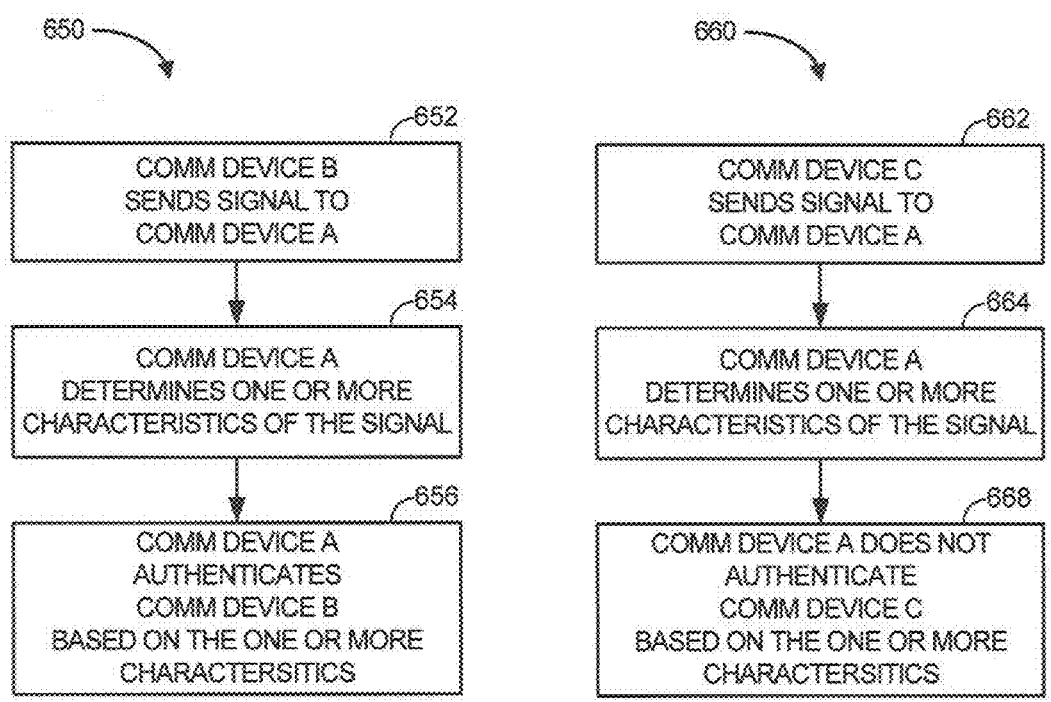
FIG. 6B
FIG. 6C

SYSTEM AND METHOD FOR GENERATING A DEFINED PULSE

CROSS REFERENCE TO A RELATED APPLICATION

This application claims priority to the filing date of Provisional Patent Application Ser. No. 61/239,965, filed on Sep. 4, 2009, and entitled "System and Method for Generating a Defined Pulse," which is incorporated herein by reference.

FIELD

The present disclosure relates generally to communication systems, and more specifically, to a system and method for generating a defined signal, such as a defined pulse.

BACKGROUND

In communication systems, signals are often transmitted from a communication device to a remote communication device via a wireless or free space medium. These communication devices typically employ a transmitter for transmitting the signal long distances via the wireless medium. In many cases, the transmitter is operated continuously whether or not signals are being transmitted. In some cases, operating a transmitter in a continuous manner may be acceptable. However, when the power source is limited, this may not be desirable since the transmitter may not be able to be operated continuously for a long time.

For instance, many communication devices are portable devices, such as cellular telephones, personal digital assistants (PDAs), handheld devices, and other portable communication devices. These portable communication devices typically rely on a limited power source, such as a battery, to perform the various intended operations. A limited power source typically has a continuous use lifetime that depends on the amount of power used by the portable device. It is generally desirable to extend the continuous use lifetime as much as possible. Accordingly, portable communication devices are more frequently designed to consume less and less power.

One technique for operating a transmitter in a more power efficient manner is to use pulse-based modulation techniques (e.g., pulse-position modulation) to transmit signals. In such a system, a transmitter may be operated in a relatively high power consumption mode during the transmission of a pulse signal. However, when the transmitter is not being used to transmit the pulse signal, it is operated in a relatively low power consumption mode in order to conserve power. Accordingly, such transmitter should be able to seamlessly transition from the low power consumption mode to the high power consumption mode in a manner that the generated pulse meets defined specifications for proper communication with the remote communication device.

SUMMARY

An aspect of the disclosure relates to an apparatus for generating a first signal. The apparatus comprises a current source adapted to generate a current based on a second signal that defines an amplitude of the current and a third signal that defines the timing of an amplitude change of the current, and an impedance element through which the current flows to generate the first signal. In another aspect, the first signal comprises a defined pulse. In yet another aspect, the impedance element comprises a resonator or an impedance matching network.

In another aspect of the disclosure, the second signal controls the rise and fall of the amplitude of the first signal. In another aspect, the third signal controls a step or time interval of the change of the amplitude of the first signal. In yet another aspect, the current source comprises one or more selectable current paths. In still another aspect, the current source is adapted to generate or cease generating the current in response to a fourth signal.

In another aspect of the disclosure, the apparatus further comprises a local oscillator (LO) adapted to initiate the fourth signal. In yet another aspect, the apparatus comprises a detector adapted to generate the fourth signal to enable the current source in response to detecting a defined steady-state condition of a clock signal generated by the LO. In still another aspect, the apparatus further comprises a detector adapted to generate the fourth signal to disable the current source in response to the first signal.

In another aspect of the disclosure, the apparatus further comprises a controller adapted to generate the second signal based on the first or third signal to control the power level of the first signal and/or for other purposes. In yet another aspect, the apparatus further comprises a controller adapted to generate the second and third signals based on the first signal to control the power level of the first signal and/or for other purposes. In still another aspect, one or more characteristics of the first signal may be used for authenticating a communication session.

In another aspect of the disclosure, other aspects, advantages and novel features of the present disclosure will become apparent from the following detailed description of the disclosure when considered in conjunction with the accompanying drawings.

BRIEF DESCRIPTION OF THE DRAWINGS

FIG. 6A illustrates a block diagram of an exemplary communication system in accordance with another aspect of the disclosure.

FIG. 6B illustrates a flow diagram of an exemplary method of authenticating a communication session in accordance with another aspect of the disclosure.

FIG. 6C illustrates a flow diagram of an exemplary method of not authenticating a communication session in accordance with another aspect of the disclosure.

DETAILED DESCRIPTION

Various aspects of the disclosure are described below. It should be apparent that the teachings herein may be embodied in a wide variety of forms and that any specific structure, function, or both being disclosed herein are merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Figure 1:
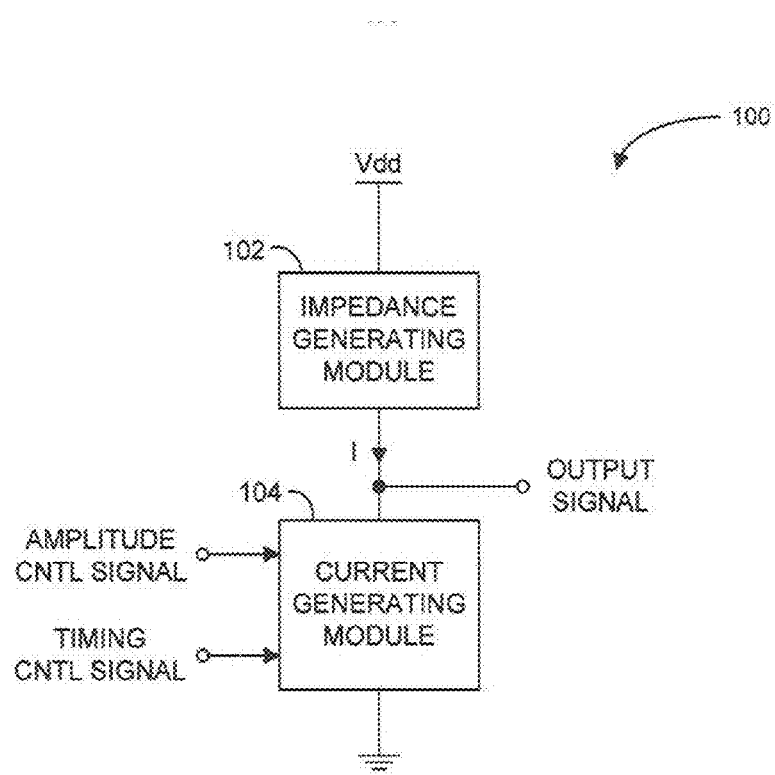
FIG. 1 illustrates a block diagram of an exemplary apparatus for generating a pulse signal in accordance with an aspect of the disclosure.

FIG. 1 illustrates a block diagram of an exemplary apparatus 100 for generating a pulse signal in accordance with an aspect of the disclosure. In summary, the apparatus 100 uses a current generating module to generate a current in response to an amplitude control signal that defines the amplitude of the current, and a timing control signal that defines the timing of the amplitude change of the current. The generated current is applied through an impedance generating module in order to generate the pulse signal. The amplitude and timing control signals may be configured in order to achieve a particular or defined shape and/or frequency spectrum for the pulse signal. Although a pulse signal is used to exemplify the concepts herein, it shall be understood that other types of signals may be formed.

More specifically, the apparatus 100 comprises an impedance generating module 102 and a current generating module 104 coupled in series between a positive power supply rail Vdd and a negative power supply rail, which could be at ground potential as shown or a potential more negative than the positive power supply rail Vdd. The current generating module 104 is adapted to generate a current I in response to an amplitude control signal that defines the amplitude of the current, and a timing control signal that defines the timing of the amplitude change of the current. The current I flows through the impedance generating module 102 and the current source module 104 to generate the output signal (e.g., the pulse signal) at a node between the impedance module and the current source module. The following describes an example of how the amplitude and timing control signals may be configured to generate a defined pulse.

Figure 2:
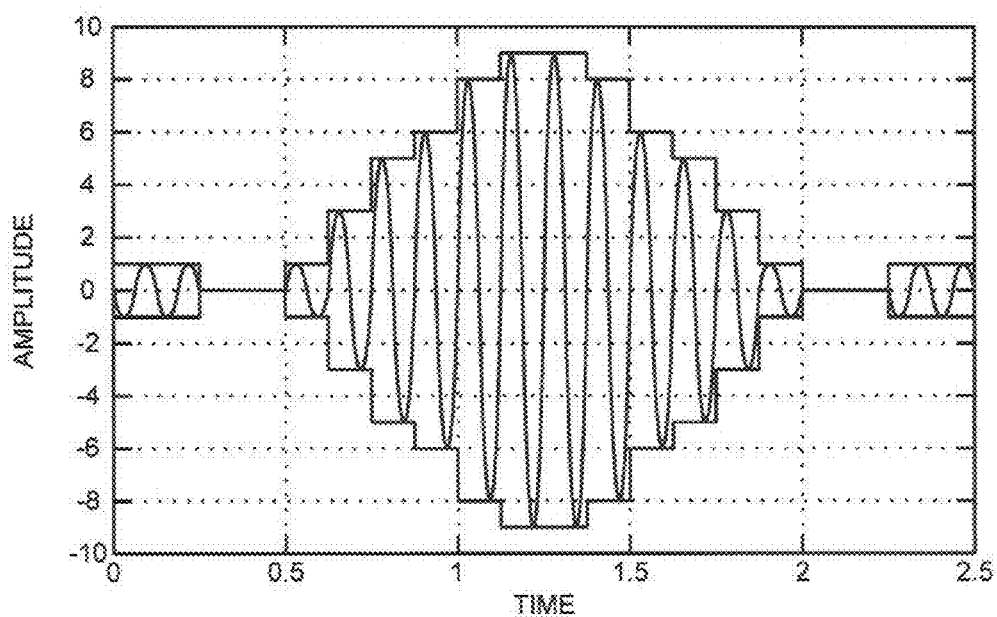
FIG. 2 illustrates a graph of an exemplary pulse signal in accordance with another aspect of the disclosure.

FIG. 2 illustrates a graph of an exemplary pulse signal in accordance with another aspect of the disclosure. The vertical or y-axis of the graph represents the amplitude of the signal, and the horizontal or x-axis represents time. As noted, in this example, the amplitude control signal defines the amplitude of the pulse in steps. For instance, within time interval 0.5 to 0.625, the amplitude of the pulse is varying between ±1, which, in this example, marks the beginning of the pulse. Within time interval 0.625 to 0.75, the amplitude of the pulse is varying between ±3. The amplitude of the pulse continues to rise until it reaches a maximum of ±9 at time interval 1.125 to 1.375. Then, the amplitude decreases until it returns back to an amplitude varying between ±1 at time interval 1.825 to 2.0, which marks the end of the pulse. Although, in this example, the amplitude of the pulse is controlled in steps, it shall be understood that it may be controlled in a continuous fashion.

Also, as noted in the graph, the timing control signal defines when the change in the amplitude of the pulse occurs. In this example, the change in the amplitude occurs substantially at phase zero (0) of a sinewave driving the pulse generating apparatus, as discussed in more detail later. For instance, in this example, the amplitude of the pulse changed from ±1 to ±3 at substantially phase zero (0) of the sinewave at approximately time 0.625. Similarly, the amplitude of the pulse changed from ±3 to ±5 at substantially phase zero (0) of the sinewave at approximately time 0.75. Likewise, the amplitude of the pulse changed from ±5 to ±6 at substantially phase zero (0) of the sinewave at approximately time 0.875, and so on. It shall be understood that the timing control signal may initiate the change in the amplitude at other phases or in other manners.

Figure 3:
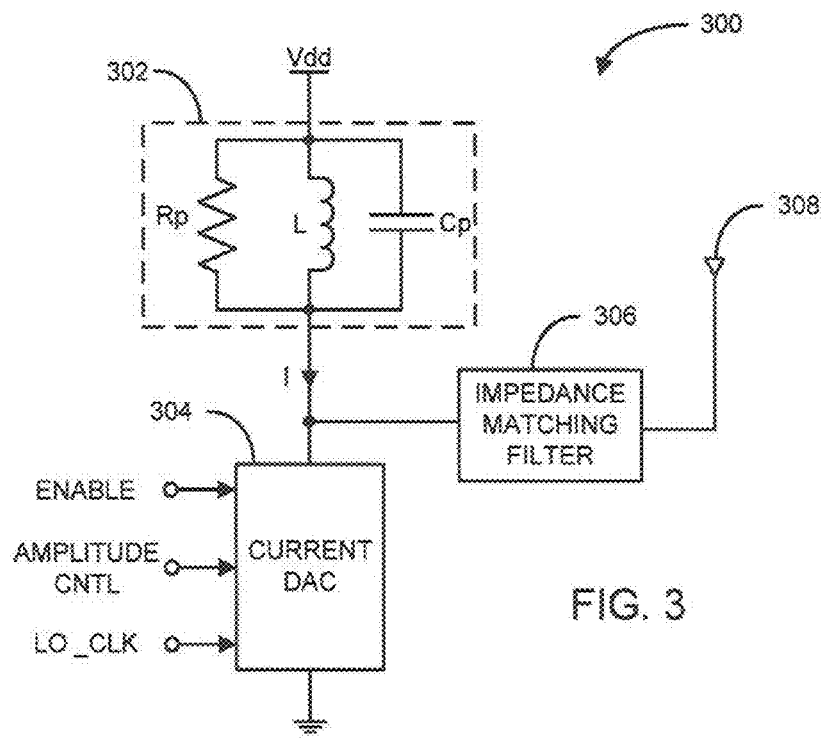
FIG. 3 illustrates a block diagram of another exemplary apparatus for generating a pulse signal in accordance with another aspect of the disclosure.

FIG. 3 illustrates a block diagram of another exemplary apparatus 300 for generating a pulse signal in accordance with another aspect of the disclosure. In this example, the pulse generating apparatus 300 is particularly suited to generate a signal for transmission via a wireless medium. In summary, the apparatus 300 includes a current source module, such as a current digital-to-analog converter (DAC), to generate a current in response to an amplitude control signal, a timing control signal, and an enable signal. The apparatus 300 further includes a resonator through which the current flows to generate the pulse signal. The resonator including an additional impedance matching network efficiently couples the pulse signal to an antenna for transmission via the wireless interface.

More specifically, the apparatus 300 comprises a resonator 302, a current DAC 304, an impedance matching filter 306, and an antenna 308. The resonator 302, in turn, comprises an inductor L, a capacitor Cp, and a resistor Rp, all coupled in parallel. The resonator 302 and the current DAC 304 are coupled in series between a positive power supply rail Vdd and a negative power supply rail, which could be at ground potential as shown or a potential more negative than the positive power supply rail Vdd. The current DAC 304 generates a current I in response to an enable signal, an amplitude control signal, and an LO clock signal LO_CLK. The enable signal activates the current DAC 304 to generate the current I, and also deactivates the current DAC from generating the current I. The amplitude control signal defines the amplitude of the current generated by the current DAC 304. The LO clock signal LO_CLK defines the timing of the change in the amplitude of the current generated by the current DAC 304. The current I generated by the current DAC 304 flows through the resonator 302 to generate the pulse signal at a node between the resonator and current DAC 304. The resonator 302, and specifically its components L, Cp and Rp, may be configured to have a resonant frequency at or approximate the center of the frequency spectrum of the pulse signal. The resonator 302 may further be configured to provide a change in the impedance at the node between the resonator and current DAC 304 to achieve a smoother impedance transition to that of the antenna 308 and free space medium. Additionally, the impedance matching filter 306 provides further impedance matching at the frequencies of interest in order to provide a more efficient coupling of the pulse signal to the antenna 308.

Figure 4:
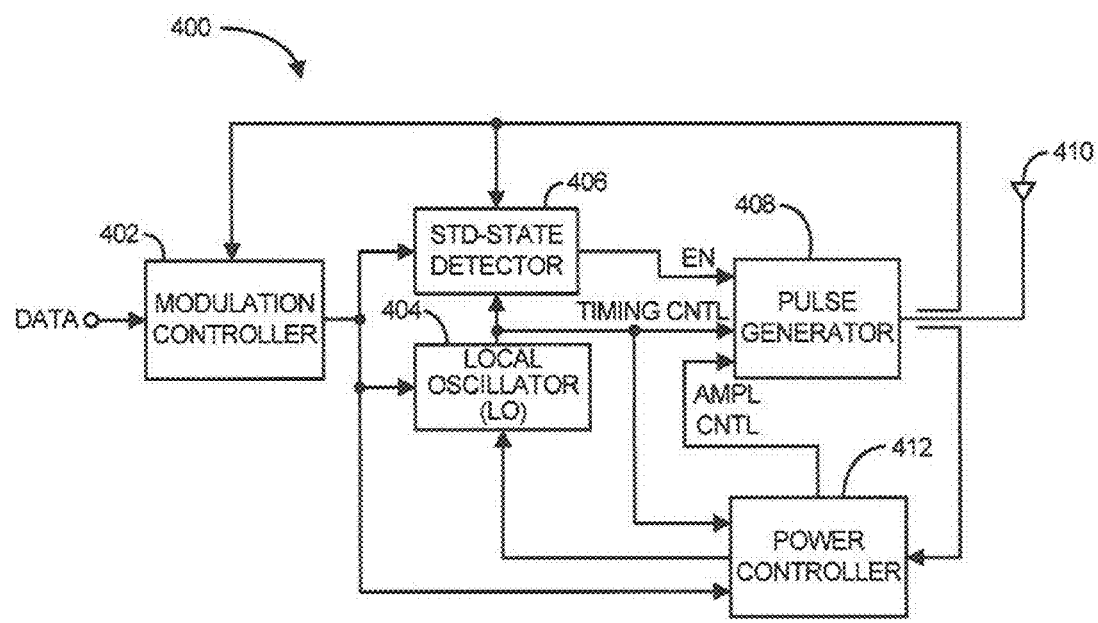
FIG. 4 illustrates a block diagram of another exemplary apparatus for transmitting a pulse signal in accordance with another aspect of the disclosure.

FIG. 4 illustrates a block diagram of another exemplary apparatus 400 for transmitting a pulse signal in accordance with another aspect of the disclosure. In this example, the pulse generating apparatus 400 is particularly suited to generate a signal for transmission via a wireless medium. In summary, the apparatus 400 includes a modulation controller to initiate a pulse signal in response to input data, an LO to generate the timing signal for a pulse generator, a steady-state detector to enable the pulse generator in response to detecting a defined steady-state condition of the timing signal and to disable the pulse generator in response to the generated pulse signal, and a power controller to generate the amplitude control signal in response to the generated pulse signal and the timing signal.

More specifically, the apparatus 400 comprises a modulation controller 402, a local oscillator (LO) 404, a steady-state detector 406, a pulse generator 408, an antenna 410, and a power controller 412. The modulation controller 402 includes an input adapted to receive data for transmission to a remote device via a wireless medium, and an output for generating a pulse initiating signal based on the received data. The output of the modulation controller 402 is coupled to an enable input of the LO 404, an enable input of the steady-state detector 406, and an enable input of the power controller 412. In response to the pulse initiating signal generated by the modulation controller 402, the LO 404 begins generating the timing control signal, the steady-state detector 406 begins detecting whether the timing control signal has reached a defined steady-state condition (e.g., a defined amplitude, amplitude stability, frequency, frequency stability, and/or other characteristics), and the power controller 412 generates an amplitude control signal for the pulse generator 408.

When the steady-state detector 406 has detected that the timing control signal has reached the defined steady-state condition, the steady-state detector 406 asserts an enable signal for the pulse generator 408. In response to the asserted enable signal, the pulse generator 408 generates the pulse signal based on the amplitude control signal and the timing control signal. As previously discussed, the amplitude control signal defines the amplitude of the current that produces the pulse signal, and the timing control signal defines the timing of the amplitude change in the current that produces the pulse signal. The pulse generator 408 provides the pulse signal to the antenna 410 for transmission via the wireless medium. The modulation controller 402 and the steady-state detector 406 monitor the generated pulse to detect the end of the pulse. When the end of the pulse is detected, the steady-state detector 406 de-asserts the enable signal to configure the pulse generator 408 in a low power consumption mode. Similarly, in response to detecting the end of the pulse, the modulation controller de-asserts its output to configure the LO 404, steady-state detector 406, and power controller 412 in a lower power consumption mode.

The power controller 412 may regulate the power of the generated pulse by configuring the amplitude control signal based on the measured power level of the pulse signal in order to maintain the power of the pulse signal within a defined range and/or for other purposes. Similarly, the power controller 412 may regulate the power of the generated pulse by configuring the amplitude control signal based on the frequency of the timing control signal in order to maintain the power of the pulse signal within a defined range and/or for other purposes. Additionally, the power controller 412 may regulate the power of the generated pulse by configuring both the amplitude control signal and the frequency of the timing control signal based on the measured power level of the pulse signal in order to maintain the power of the pulse signal within a defined range and/or for other purposes. Furthermore, the power controller 412 may change or regulate the amplitude of each cycle that makes up the pulse signal.

Figure 5A:
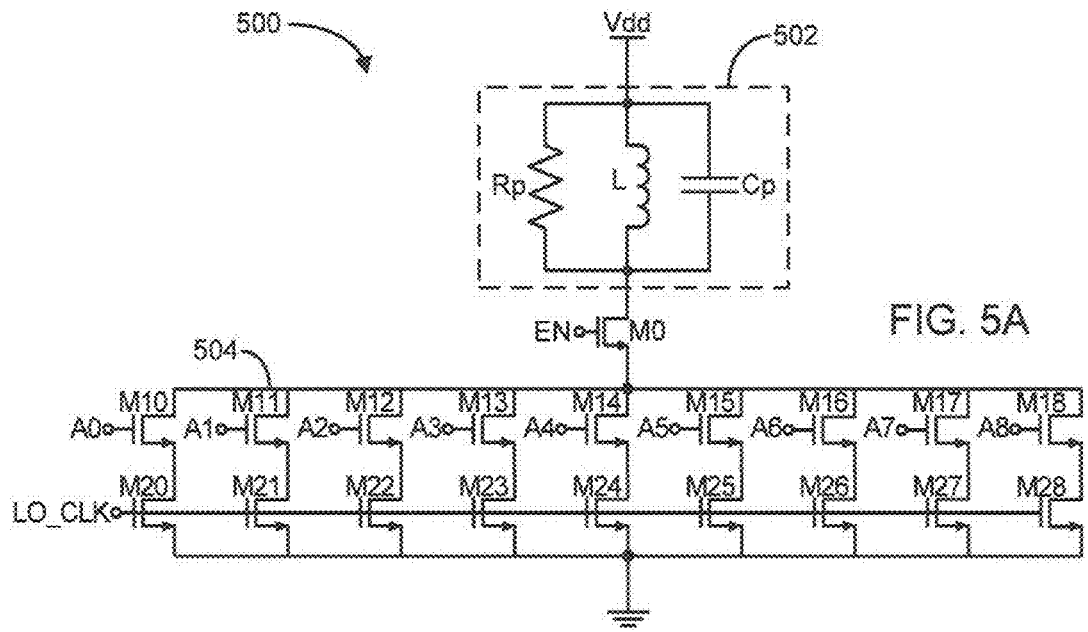
FIG. 5A illustrates a block diagram of another exemplary apparatus for generating a pulse signal in accordance with another aspect of the disclosure.

FIG. 5A illustrates a block diagram of another exemplary apparatus 500 for generating a pulse signal in accordance with another aspect of the disclosure. The apparatus 500 provides an exemplary more detailed implementation of the current source or DAC previously discussed. The apparatus 500 comprises an impedance element 502, a switching element M0, and a current source or DAC 504. The impedance element 502, switching element M0, and current source or DAC 504 may be connected in series between a positive power supply rail Vdd and a negative power supply rail, which may be at ground potential or a potential more negative than the positive power supply rail Vdd.

The impedance element 502, in turn, may be configured as a resonator, including an inductor L, capacitor Cp, and resistor Rp connected in parallel, with a resonant frequency at or approximate the center of the frequency spectrum of the pulse signal. The switching element M0, in turn, may be configured as a metal oxide semiconductor field effect transistor (MOSFET) with a gate adapted to receive an enable signal, a drain coupled to the resonator 502, and a source coupled to the current source or DAC 504. The current source or DAC 504, in turn, comprises a plurality of selectable current paths, each comprising a pair of series connected MOSFETs M10-M18 and M20-M28, respectively. More specifically, the gates of the MOSFETs M10-M18 are adapted to receive the amplitude control signal bits A0-A8, respectively. The drains of the MOSFETs M10-M18 are coupled to the source of the switching MOSFET M0. The sources of MOSFETs M10-M18 are coupled to the drains of MOSFETs M20-M28, respectively. The gates of MOSFETs M20-M28 are adapted to receive the timing control signal LO_CLK. The sources of MOSFETs M20-M28 are coupled to the negative power supply rail (e.g., ground). All of the MOSFETs M10-M18 and M20-M28 may be configured to have substantially the same size so that the currents through the paths are substantially the same. The operation of the apparatus 500 is discussed as follows.

Figure 5B:
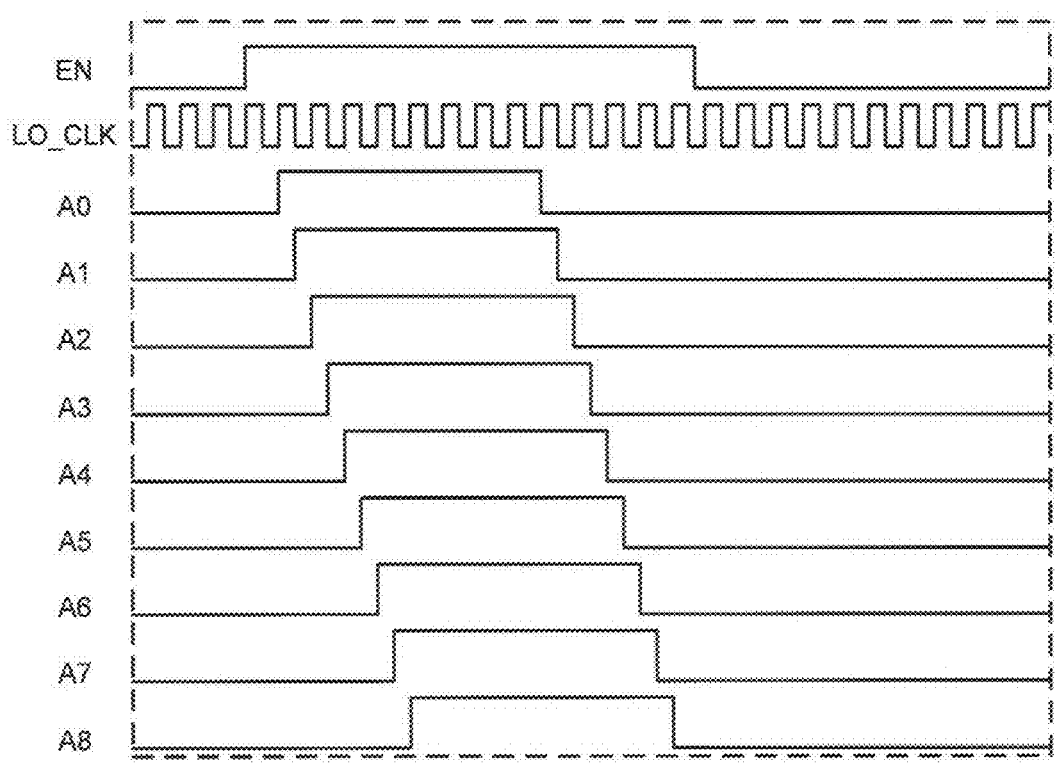
FIG. 5B illustrates timing diagrams of exemplary signals related to the operation of a pulse generating apparatus in accordance with another aspect of the disclosure.

FIG. 5B illustrates timing diagrams of exemplary signals related to the operation of the pulse generating apparatus 500 in accordance with another aspect of the disclosure. To initiate the generation of a pulse signal, the enable signal (EN) is asserted as noted in the graph by the signal transitioning from a low logic level to a high logic level. The high logic level of the enable signal (EN) turns on MOSFET M0 in order to couple the resonator 502 to the current source or DAC 504.

Shortly thereafter (e.g., one cycle of the timing control signal LO_CLK), the least significant bit A0 of the amplitude control signal transitions from a low logic level to a high logic level. This turns on MOSFET M10. The timing control signal LO_CLK, being applied to the gate of MOSFET M20, produces a periodic current to flow through the resonator 502, MOSFET M0, and selected current path made up of MOSFETs M10 and M20. This current produces the first step or portion of the pulse signal at the node between the resonator 502 and current source or DAC 504. At a subsequent time (e.g., another cycle of the timing control signal LO_CLK), the next significant bit A1 of the amplitude control signal transitions from a low logic level to a high logic level. This turns on MOSFET M11. The timing control signal LO_CLK, being applied to the gate of MOSFET M21, produces an additional periodic current to flow through the selected current path made up of MOSFETs M11 and M21. This increases the current to produce the second and higher amplitude portion of the pulse signal. This process continues until all of the current paths are turned on to produce the peak amplitude of the pulse signal.

Then, the most significant bit A0 of the amplitude control signal transitions from the high logic level to the low logic level. The low logic level turns off MOSFET M10. This disables or deselects the current path made up of MOSFETs M10 and M20. This decreases the current to decrease the amplitude of the pulse signal from its peak value. At a subsequent time (e.g., another cycle of the timing control signal LO_CLK), the next significant bit A1 of the amplitude control signal transitions from the high logic level to the low logic level. This turns off MOSFET M11. This disables or deselects the current path made up of MOSFETs M11 and M21. This, in turn, decreases the current to further decrease the amplitude of the pulse signal. This process continues until all of the current paths are turned off, thereby completing the generation of the pulse signal.

FIG. 6A illustrates a block diagram of an exemplary communication system 600 in accordance with another aspect of the disclosure. In summary, one or more characteristics of the pulse signal generated and transmitted may be used to authenticate a remote communication device and not authenticate another remote device. The one or more characteristics of the signal may include the power, spectral profile, pulse shape, etc. A communication device receiving the signal from a remote communication device may use any one or more characteristics of the signal to authenticate the communication session with the remote device.

In particular, the communication system 600 comprises a communication device A 602, a communication device B 604, and a communication device C 606. In this example, the communication devices communicate with each other using radio frequency (RF) signals (e.g., ultra wideband (UWB) pulses) transmitted via a wireless medium. Additionally, in this example, the communication device A 602 is attempting to authenticate a communication session with communication device B 604, and another communication session with communication device C 606. The following describes how communication device A 602 uses the signals transmitted communication devices B 604 and C 606 to attempt to authenticate the respective communication sessions with these devices.

FIG. 6B illustrates a flow diagram of an exemplary method 650 of authenticating a communication session in accordance with another aspect of the disclosure. According to the method 650, the communication device B 604 sends a signal (e.g., a pulse signal as previously described) to the communication device A 602 (block 652). After receiving the signal from communication device B 604, the communication device A 602 determines one or more characteristics of the signal (block 654). As previously discussed, some characteristics of the signal that may be used include power, spectral profile, shape, time of arrival of received pulse, etc. As an example, the power of the received signal may indicate the distance between communication devices A and B. If, for example, the received signal power is relatively high, it may indicate that the communication device A and B are relatively close to each other. As a result, the communication device A 602 may authenticate the communication session with communication device B 604 based on the one or more characteristics of the received signal (block 656).

FIG. 6C illustrates a flow diagram of an exemplary method 660 of not authenticating a communication session in accordance with another aspect of the disclosure. According to the method 660, the communication device C 606 sends a signal (e.g., a pulse signal as previously described) to the communication device A 602 (block 662). After receiving the signal from communication device C 606, the communication device A 602 determines one or more characteristics of the signal (block 664). As previously discussed, some characteristics of the signal that may be used include power, spectral profile, shape, etc. As an example, the power of the received signal may indicate the distance between communication devices A and C. If, for example, the received signal power is relatively low, it may indicate that the communication device A and C are relatively far from each other. As a result, the communication device A 602 may not authenticate the communication session with communication device C 606 based on the one or more characteristics of the received signal (block 668).

Figure 7:
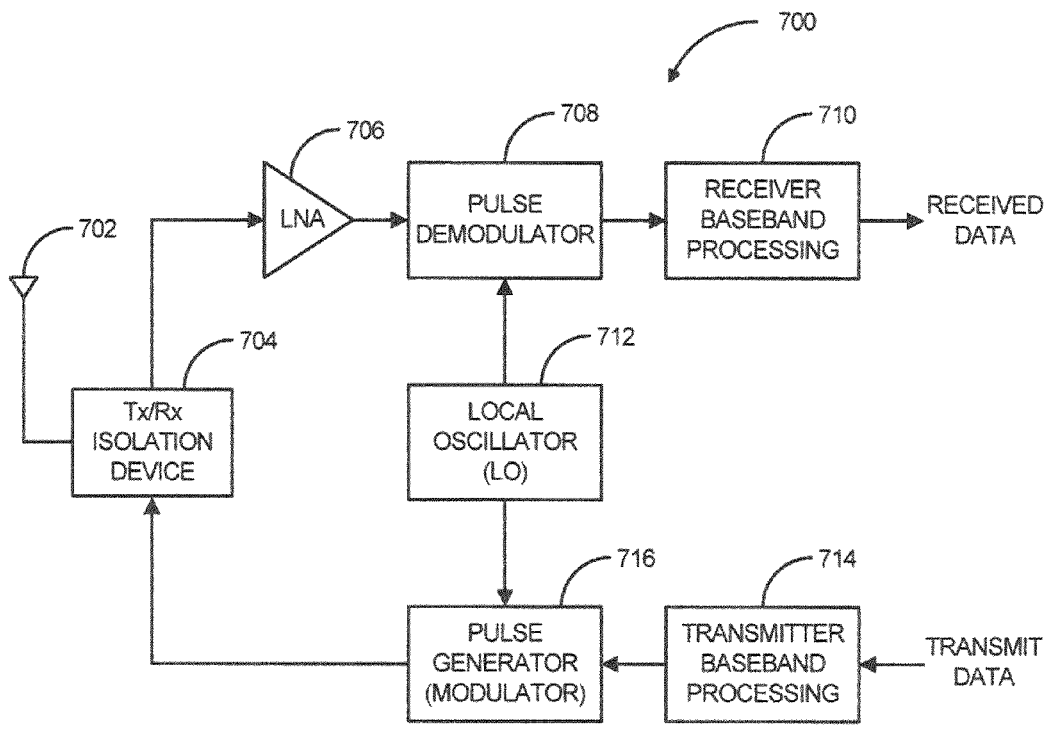
FIG. 7 illustrates a block diagram of an exemplary transceiver in accordance with another aspect of the disclosure.

FIG. 7 illustrates a block diagram of an exemplary communication device 700 in accordance with another aspect of the disclosure. The communication device 700 may be one exemplary implementation of a communication device that uses any of the apparatuses previously discussed that generates a signal (e.g., a defined pulse) for transmission to a remote communication device. In particular, the communication device 700 comprises an antenna 702, a Tx/Rx isolation device 704, a low noise amplifier (LNA) 706, a pulse demodulator 708, a receiver baseband processing module 710, a local oscillator (LO) 712, a transmitter baseband processing module 714, and a pulse generator (modulator) 716. As previously discussed, the pulse generator (modulator) 716 may be configured to include any of the apparatuses previously described that generates a defined signal (e.g., a defined pulse).

As a source communication device, data to be transmitted to a destination communication device is sent to the transmitter baseband processing module 714. The transmitter baseband processing module 714 processes the transmit data to generate an outgoing baseband signal. The pulse modulator 716, using a signal generated by the local oscillator (LO) 712, processes the outgoing baseband signal to generate an RF signal, which is provided to the antenna 702 via the Tx/Rx isolation device 704 for transmission into a wireless medium. The transmit data may be generated by a sensor, a microprocessor, a microcontroller, a RISC processor, a keyboard, a pointing device such as a mouse or a track ball, an audio device, such as a headset, including a transducer such as a microphone, a medical device, a shoe, a robotic or mechanical device that generates data, a user interface, such as a touch-sensitive display, a user device etc. As an example, a user device may be a watch worn to display at least one of the following indications: (1) how fast you're running based on its communication with a sensor in one's shoes; (2) how far you have run; or (3) one's heart rate based on its communication with a sensor attached to one's body. Alternatively, instead of a watch, the user device may be mounted on a bicycle to display such indications.

As a destination communication device, an RF signal carrying data is picked up by the antenna 702 and applied to the LNA 706 via the Tx/Rx isolation device 704. The LNA 706 amplifies the received RF signal. The pulse demodulator 708, using a signal generated by the local oscillator (LO) 712, processes the received RF signal to generate a received baseband signal. The receiver baseband processing module 710 processes the received baseband signal to produce the received data. A data processor (not shown) may then perform one or more defined operations based on the received data. For example, the data processor may include a microprocessor, a microcontroller, a reduced instruction set computer (RISC) processor, a display, an audio device such as a headset including a transducer such as speakers, a medical device, a watch, a shoe, a robotic or mechanical device responsive to the data, a user interface, such as a display, one or more light emitting diodes (LED), a user device, etc.

Figure 8:
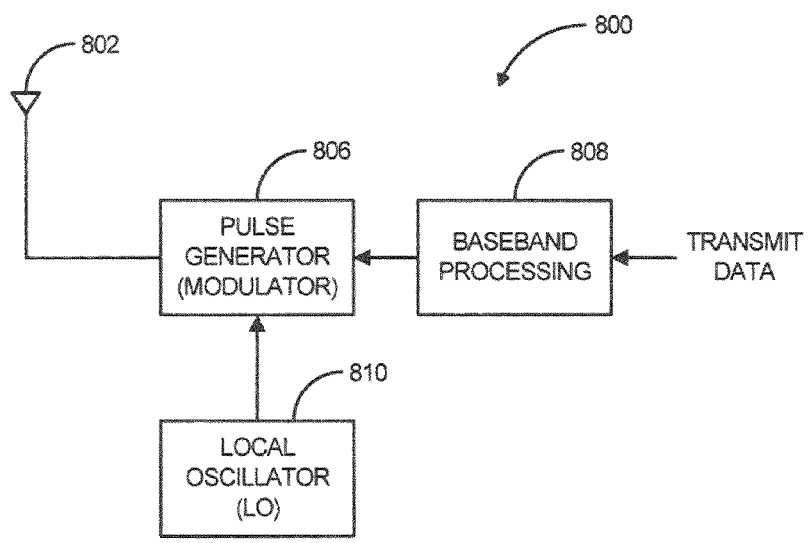
FIG. 8 illustrates a block diagram of an exemplary receiver in accordance with another aspect of the disclosure.

FIG. 8 illustrates a block diagram of an exemplary communication device 800 in accordance with another aspect of the disclosure. The communication device 800 may be one exemplary implementation of a communication device that uses any of the apparatuses previously discussed to generate a defined signal (e.g., a defined pulse). In particular, the communication device 800 comprises an antenna 802, a pulse generator (modulator) 806, a local oscillator (LO) 810, and a baseband processing module 808. The pulse generator (modulator) 806 may be configured to include any of the apparatuses previously described that generates a defined signal (e.g., a defined pulse).

In operation, data to be transmitted to a destination communication device is sent to the baseband processing module 808. The baseband processing module 808 processes the transmit data to generate a baseband signal. The pulse modulator 806, using a signal generated by the local oscillator (LO) 810, processes the baseband signal to generate an RF signal, which is provided to the antenna 802 for transmission into a wireless medium. The transmit data may be generated by a sensor, a microprocessor, a microcontroller, a RISC processor, a keyboard, a pointing device such as a mouse or a track ball, an audio device, such as a headset, including a transducer such as a microphone, a medical device, a shoe, a robotic or mechanical device that generates data, a user interface, such as a touch-sensitive display, a user device, etc.

Figure 9A:
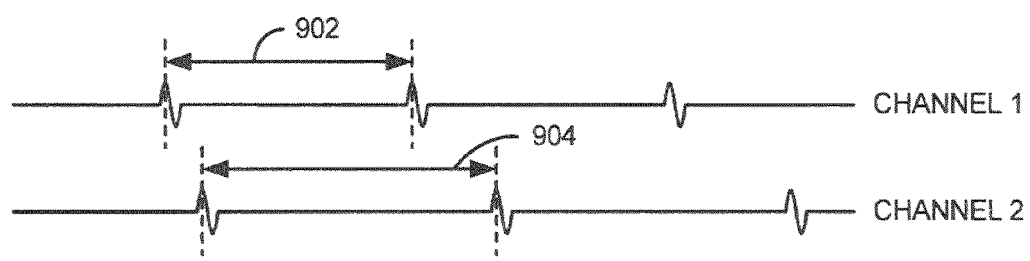
FIGS. 9A-D illustrate timing diagrams of various pulse modulation techniques in accordance with another aspect of the disclosure.

FIG. 9A illustrates different channels (channels 1 and 2) defined with different pulse repetition frequencies (PRF) as an example of a pulse modulation that may be employed in any of the communications systems, devices, and apparatuses described herein. Specifically, pulses for channel 1 have a pulse repetition frequency (PRF) corresponding to a pulse-to-pulse delay period 902. Conversely, pulses for channel 2 have a pulse repetition frequency (PRF) corresponding to a pulse-to-pulse delay period 904. This technique may thus be used to define pseudo-orthogonal channels with a relatively low likelihood of pulse collisions between the two channels. In particular, a low likelihood of pulse collisions may be achieved through the use of a low duty cycle for the pulses. For example, through appropriate selection of the pulse repetition frequencies (PRF), substantially all pulses for a given channel may be transmitted at different times than pulses for any other channel.

The pulse repetition frequency (PRF) defined for a given channel may depend on the data rate or rates supported by that channel. For example, a channel supporting very low data rates (e.g., on the order of a few kilobits per second or Kbps) may employ a corresponding low pulse repetition frequency (PRF)). Conversely, a channel supporting relatively high data rates (e.g., on the order of a several megabits per second or Mbps) may employ a correspondingly higher pulse repetition frequency (PRF).

Figure 9B:
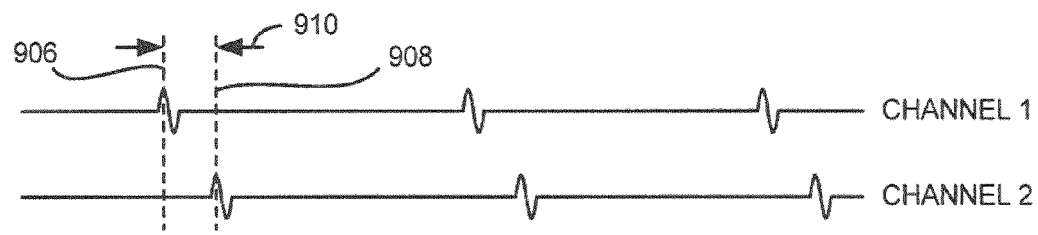

FIG. 9B illustrates different channels (channels 1 and 2) defined with different pulse positions or offsets as an example of a modulation that may be employed in any of the communications systems described herein. Pulses for channel 1 are generated at a point in time as represented by line 906 in accordance with a first pulse offset (e.g., with respect to a given point in time, not shown). Conversely, pulses for channel 2 are generated at a point in time as represented by line 908 in accordance with a second pulse offset. Given the pulse offset difference between the pulses (as represented by the arrows 910), this technique may be used to reduce the likelihood of pulse collisions between the two channels. Depending on any other signaling parameters that are defined for the channels (e.g., as discussed herein) and the precision of the timing between the devices (e.g., relative clock drift), the use of different pulse offsets may be used to provide orthogonal or pseudo-orthogonal channels.

Figure 9C:
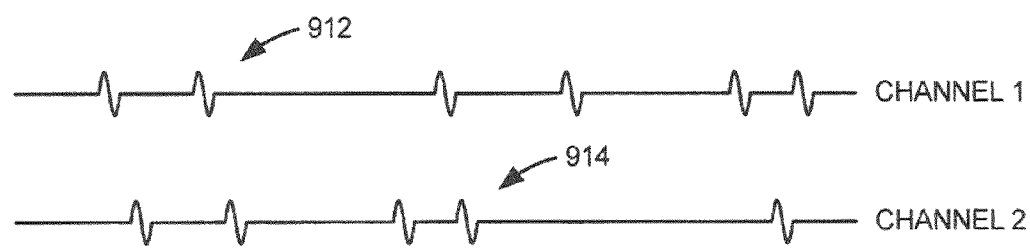

FIG. 9C illustrates different channels (channels 1 and 2) defined with different timing hopping sequences modulation that may be employed in any of the communications systems described herein. For example, pulses 912 for channel 1 may be generated at times in accordance with one time hopping sequence while pulses 914 for channel 2 may be generated at times in accordance with another time hopping sequence. Depending on the specific sequences used and the precision of the timing between the devices, this technique may be used to provide orthogonal or pseudo-orthogonal channels. For example, the time hopped pulse positions may not be periodic to reduce the possibility of repeat pulse collisions from neighboring channels.

Figure 9D:
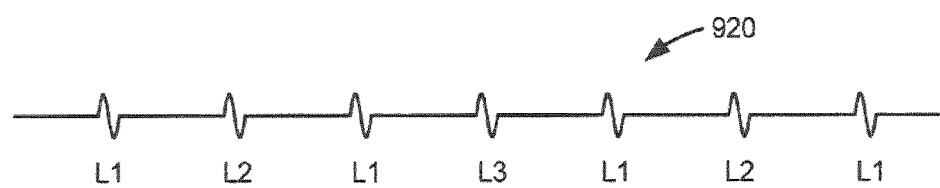

FIG. 9D illustrates different channels defined with different time slots as an example of a pulse modulation that may be employed in any of the communications systems described herein. Pulses for channel L1 are generated at particular time instances. Similarly, pulses for channel L2 are generated at other time instances. In the same manner, pulse for channel L3 are generated at still other time instances. Generally, the time instances pertaining to the different channels do not coincide or may be orthogonal to reduce or eliminate interference between the various channels.

It should be appreciated that other techniques may be used to define channels in accordance with other pulse modulation schemes. For example, a channel may be defined based on different spreading pseudo-random number sequences, or some other suitable parameter or parameters. Moreover, a channel may be defined based on a combination of two or more parameters.

Figure 10:
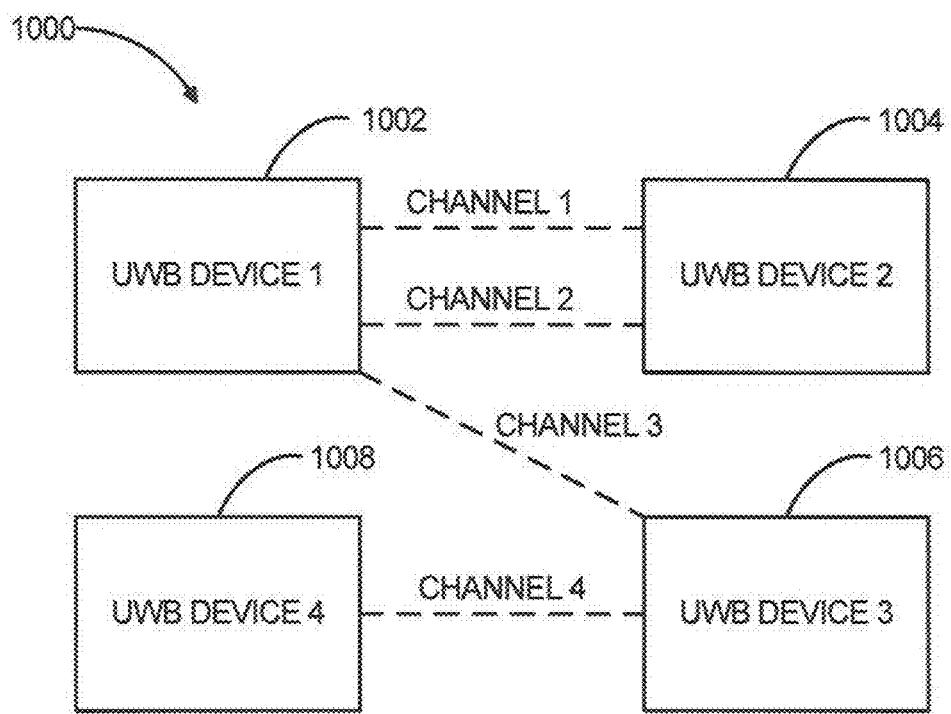
FIG. 10 illustrates a block diagram of various communications devices communicating with each other via various channels in accordance with another aspect of the disclosure.

FIG. 10 illustrates a block diagram of various ultra-wide band (UWB) communications devices communicating with each other via various channels in accordance with another aspect of the disclosure. For example, UWB device 1 1002 is communicating with UWB device 2 1004 via two concurrent UWB channels 1 and 2. UWB device 1002 is communicating with UWB device 3 1006 via a single channel 3. And, UWB device 3 1006 is, in turn, communicating with UWB device 4 1008 via a single channel 4. Other configurations are possible. The communications devices may be used for many different applications, and may be implemented, for example, in a headset, microphone, biometric sensor, heart rate monitor, pedometer, EKG device, watch, shoe, remote control, switch, tire pressure monitor, or other communications devices. A medical device may include smart band-aid, sensors, vital sign monitors, and others. The communications devices described herein may be used in any type of sensing application, such as for sensing automotive, athletic, and physiological (medical) responses.

Any of the above aspects of the disclosure may be implemented in many different devices. For example, in addition to medical applications as discussed above, the aspects of the disclosure may be applied to health and fitness applications. Additionally, the aspects of the disclosure may be implemented in shoes for different types of applications. There are other multitude of applications that may incorporate any aspect of the disclosure as described herein.

Various aspects of the disclosure have been described above. It should be apparent that the teachings herein may be embodied in a wide variety of forms and that any specific structure, function, or both being disclosed herein is merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using another structure, functionality, or structure and functionality in addition to or other than one or more of the aspects set forth herein. As an example of some of the above concepts, in some aspects concurrent channels may be established based on pulse repetition frequencies. In some aspects concurrent channels may be established based on pulse position or offsets. In some aspects concurrent channels may be established based on time hopping sequences. In some aspects concurrent channels may be established based on pulse repetition frequencies, pulse positions or offsets, and time hopping sequences.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, processors, means, circuits, and algorithm steps described in connection with the aspects disclosed herein may be implemented as electronic hardware (e.g., a digital implementation, an analog implementation, or a combination of the two, which may be designed using source coding or some other technique), various forms of program or design code incorporating instructions (which may be referred to herein, for convenience, as "software" or a "software module"), or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented within or performed by an integrated circuit ("IC"), an access terminal, or an access point. The IC may comprise a general purpose processor, a digital signal processor (DSP), an application specific integrated circuit (ASIC), a field programmable gate array (FPGA) or other programmable logic device, discrete gate or transistor logic, discrete hardware components, electrical components, optical components, mechanical components, or any combination thereof designed to perform the functions described herein, and may execute codes or instructions that reside within the IC, outside of the IC, or both. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. It is understood that any specific order or hierarchy of steps in any disclosed process is an example of a sample approach. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

The steps of a method or algorithm described in connection with the aspects disclosed herein may be embodied directly in hardware, in a software module executed by a processor, or in a combination of the two. A software module (e.g., including executable instructions and related data) and other data may reside in a data memory such as RAM memory, flash memory, ROM memory, EPROM memory, EEPROM memory, registers, a hard disk, a removable disk, a CD-ROM, or any other form of computer-readable storage medium known in the art. A sample storage medium may be coupled to a machine such as, for example, a computer/processor (which may be referred to herein, for convenience, as a "processor") such the processor can read information (e.g., code) from and write information to the storage medium. A sample storage medium may be integral to the processor. The processor and the storage medium may reside in an ASIC. The ASIC may reside in user equipment. In the alternative, the processor and the storage medium may reside as discrete components in user equipment. Moreover, in some aspects any suitable computer-program product may comprise a computer-readable medium comprising codes relating to one or more of the aspects of the disclosure. In some aspects a computer program product may comprise packaging materials.

While the invention has been described in connection with various aspects, it will be understood that the invention is capable of further modifications. This application is intended to cover any variations, uses or adaptation of the invention following, in general, the principles of the invention, and including such departures from the present disclosure as come within the known and customary practice within the art to which the invention pertains.

What is claimed is:

1. An apparatus for generating a first signal, comprising:
   a current source adapted to generate a current based on a second signal that defines an amplitude of the current and a third signal that defines the timing of an amplitude change of the current, wherein the third signal comprises a periodic signal, and wherein the second signal is configured to effectuate the amplitude change of the current on a per cycle basis of the periodic signal;
   an impedance element through which the current flows to generate the first signal, wherein the first signal comprises a defined pulse, and wherein a duration of the defined pulse is based on a defined number of cycles of the periodic signal;
   an oscillator configured to generate the periodic signal;
   a steady-state detector configured to enable the current source to generate the current in response to detecting a defined steady-state condition of the periodic signal; and
   a controller adapted to generate the second signal based on the first or third signal.

2. The apparatus of claim 1, wherein the impedance element comprises a resonator.

3. The apparatus of claim 1, wherein the impedance element comprises an impedance matching network.

4. The apparatus of claim 1, wherein the second signal controls rise and fall of the amplitude of the first signal.

5. The apparatus of claim 1, wherein the third signal controls a step or time interval of the change in amplitude of the first signal.

6. The apparatus of claim 1, wherein the current source comprises one or more selectable current paths.

7. The apparatus of claim 1, wherein the steady-state detector is further adapted to disable the current source in response to detecting an end of the defined pulse.

8. The apparatus of claim 1, wherein the controller is adapted to generate the second and third signals based on the first signal.

9. The apparatus of claim 1, wherein a characteristic of the first signal is used for authenticating a communication session.

10. A method of generating a first signal, comprising:
generating a current based on a second signal that defines an amplitude of the current and a third signal that defines the timing of an amplitude change of the current, wherein the third signal comprises a periodic signal, and wherein the second signal is configured to effectuate the amplitude change of the current on a per cycle basis of the periodic signal;
applying the current through an impedance element to generate the first signal, wherein the first signal comprises a defined pulse, and wherein a duration of the defined pulse is based on a defined number of cycles of the periodic signal;
generating the periodic signal;
enabling the generation of the current in response to detecting a defined steady-state condition of the periodic signal; and
generating the second signal based on the first or third signal.

11. The method of claim 10, wherein the impedance element comprises a resonator.

12. The method of claim 10, wherein applying the current through the impedance element comprises applying the current through an impedance matching network.

13. The method of claim 10, further comprising configuring the second signal to control rise and fall of the amplitude of the first signal.

14. The method of claim 10, further comprising configuring the third signal to control a step or time interval of the change in amplitude of the first signal.

15. The method of claim 10, wherein generating the current comprises selecting one or more current paths to generate the current.

16. The method of claim 10, further comprising ceasing the generation of the current in response to detecting an end of the defined pulse.

17. The method of claim 10, further comprising generating the second and third signals based on the first signal.

18. The method of claim 10, further comprising authenticating a communication session based on a characteristic of the first signal.

19. An apparatus of generating a first signal, comprising:
means for generating a current based on a second signal that defines an amplitude of the current and a third signal that defines the timing of an amplitude change of the current, wherein the third signal comprises a periodic signal, and wherein the second signal is configured to effectuate the amplitude change of the current on a per cycle basis of the periodic signal;
means for generating an impedance through which the current flows to generate the first signal, wherein the first signal comprises a defined pulse, and wherein a duration of the defined pulse is based on a defined number of cycles of the periodic signal;
means for generating the periodic signal;
means for enabling the current generating means in response to detecting a defined steady-state condition of the periodic signal; and
means for generating the second signal based on the first or third signal.

20. The apparatus of claim 19, wherein the impedance generating means comprises a resonator.

21. The apparatus of claim 19, wherein the impedance generating means comprises an impedance matching network.

22. The apparatus of claim 19, further comprising means for configuring the second signal to control rise and fall of the amplitude of the first signal.

23. The apparatus of claim 19, further comprising means for configuring the third signal to control a step or time interval of the change in amplitude of the first signal.

24. The apparatus of claim 19, wherein the means for generating the current comprises means for selecting one or more current paths to generate the current.

25. The apparatus of claim 19, further comprising means for disabling the current generating means in response to detecting an end of the defined pulse.

26. The apparatus of claim 19, further comprising means for generating the second and third signals based on the first signal.

27. The apparatus of claim 19, further comprising means for authenticating a communication session based on a characteristic of the first signal.

28. A computer program product, comprising:
a computer readable medium comprising instructions executable to generate a first signal by:
generating a current based on a second signal that defines an amplitude of the current and a third signal that defines the timing of an amplitude change of the current, wherein the third signal comprises a periodic signal, and wherein the second signal is configured to effectuate the amplitude change of the current on a per cycle basis of the periodic signal;
applying the current through an impedance element to generate the first signal, wherein the first signal comprises a defined pulse, and wherein a duration of the defined pulse is based on a defined number of cycles of the periodic signal;
generating the periodic signal;
enabling the generation of the current in response to detecting a defined steady-state condition of the periodic signal; and
generating the second signal based on the first or third signal.

29. A headset, comprising:
a transducer adapted to generate audio data; and
a transmitter adapted to transmit a first signal comprising the audio data, wherein the transmitter comprises:
a current source adapted to generate a current based on a second signal that defines an amplitude of the current and a third signal that defines the timing of an amplitude change of the current, wherein the third signal comprises a periodic signal, and wherein the second signal is configured to effectuate the amplitude change of the current on a per cycle basis of the periodic signal;
an impedance element through which the current flows to generate the first signal, wherein the first signal comprises a defined pulse, and wherein a duration of the defined pulse is based on a defined number of cycles of the periodic signal;
an oscillator configured to generate the periodic signal; and
a steady-state detector configured to enable the current source to generate the current in response to detecting a defined steady-state condition of the periodic signal.

30. A user device, comprising:
a user interface; and
a transmitter adapted to transmit a first signal comprising data received from the user interface, wherein the transmitter comprises:
- a current source adapted to generate a current based on a second signal that defines an amplitude of the current and a third signal that defines the timing of an amplitude change of the current, wherein the third signal comprises a periodic signal, and wherein the second signal is configured to effectuate the amplitude change of the current on a per cycle basis of the periodic signal;
- an impedance element through which the current flows to generate the first signal, wherein the first signal comprises a defined pulse, and wherein a duration of the defined pulse is based on a defined number of cycles of the periodic signal;
- an oscillator configured to generate the periodic signal;
- a steady-state detector configured to enable the current source to generate the current in response to detecting a defined steady-state condition of the periodic signal; and
- a controller adapted to generate the second signal based on the first or third signal.

31. A sensing device, comprising:
a sensor adapted to generate sensed data; and
a transmitter adapted to transmit a first signal comprising the sensed data, wherein the transmitter comprises:
- a current source adapted to generate a current based on a second signal that defines an amplitude of the current and a third signal that defines the timing of an amplitude change of the current, wherein the third signal comprises a periodic signal, and wherein the second signal is configured to effectuate the amplitude change of the current on a per cycle basis of the periodic signal;
- an impedance element through which the current flows to generate the first signal, wherein the first signal comprises a defined pulse, and wherein a duration of the defined pulse is based on a defined number of cycles of the periodic signal;
- an oscillator configured to generate the periodic signal; and
- a steady-state detector configured to enable the current source to generate the current in response to detecting a defined steady-state condition of the periodic signal.

* * * * *